US006320481B1

(12) United States Patent
Sharma

(10) Patent No.: US 6,320,481 B1
(45) Date of Patent: Nov. 20, 2001

(54) COMPACT PHASE SHIFTER CIRCUIT USING COUPLED LINES

(75) Inventor: Arvind K. Sharma, Torrance, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/330,679

(22) Filed: Jun. 11, 1999

(51) Int. Cl.[7] .......... H03H 7/20

(52) U.S. Cl. .......... 333/164; 333/159; 333/161

(58) Field of Search .......... 333/159, 161, 333/164, 139

(56) References Cited

U.S. PATENT DOCUMENTS

| | | | |
|---|---|---|---|
| 4,195,271 | 3/1980 | Schiek et al. | 333/161 |
| 4,616,196 | 10/1986 | Sharma | 333/161 |
| 5,116,807 * | 5/1992 | Romanofsky et al. | 505/1 |
| 5,424,696 * | 6/1995 | Nakahara et al. | 333/156 |
| 5,432,487 | 7/1995 | Dydyk | 333/161 |

OTHER PUBLICATIONS

R. V. Garver, "Broad–Band Diode Phase Shifters," IEEE Transactions on Microwave Theory and Techniques, vol. MTT–20, No. 5, May 1972, pp. 314–323.

B. M. Schiffman, "A New Class of Broad–Band Microwave 90–Degree Phase Shifters," IRE transactions on Microwave Theory and Techniques, vol. MTT–6, Apr. 1958, pp. 232–237.

R. P. Coats, "An Octave–Band Switched–Line Microstrip 3–b Diode Phase Shifter," IEEE Transactions on Microwave Theory and Techniques, vol. MTT–21, No. 7, Jul. 1973, pp. 444–449.

E.M.T. Jones and J. T. Bolljahn, "Coupled–Strip–Transmission_Line Filters and Directional Couplers," IRE Transactions on Microwave Theory and Techniques, vol. MTT–4, Apr. 1956, pp. 75–81.

* cited by examiner

*Primary Examiner*—Robert Pascal
*Assistant Examiner*—Kimberly E Glenn
(74) *Attorney, Agent, or Firm*—McAndrews, Held & Malloy, Ltd.

(57) ABSTRACT

The present invention provides a switched-line phase shifter (300) for creating a differential phase shift between switched transmission paths (302, 304). A switched-line phase shifter (300) incorporates Schiffman sections (306, 308) of lengths which are non-integer multiples of quarter-wavelength. The lengths of the Schiffman sections (306, 308) are chosen such that no isolation points, which result from frequencies at which the effective electrical length of one of the transmission paths (302, 304) is an integer multiple of $\lambda/2$, occur over the operating frequency range of the phase shifter (300). The present invention also provides a space-efficient implementation of a switched-line phase shifter (600) which utilizes switches (640, 642, 644) between Schiffman subsections (610, 630) to alternately combine and isolate the Schiffman subsections (610, 630) thereby alternately creating effective Schiffman sections of greater and lesser length respectively.

19 Claims, 5 Drawing Sheets

COMPACT PHASE SHIFTER CIRCUIT USING COUPLED LINES

BACKGROUND OF THE INVENTION

The present invention relates generally to phase shifter circuitry. More specifically, the present invention relates to switched-line phase shifters using parallel coupled line sections.

A basic component in microwave/millimeter wave circuits is the differential phase shifter. Differential phase shifters are commonly implemented using a switched-line configuration in which switching devices are used to switch a signal between alternate transmission paths. The alternate transmission paths, in turn, have different electrical lengths, and thus there is a difference in relative signal phase between signals propagated through the alternate transmission paths. For example, if a first transmission line has an electrical length of $\lambda/2$ (where $\lambda$ is the wavelength of the signal) and a second transmission line has an electrical length of $\lambda/4$, the differential phase shift between the two transmission paths is $\lambda/4$ (or 90°).

One problem with conventional switched-line phase shifters incorporating non-coupled transmission lines is that the differential phase shift varies with signal frequency. For example, a first transmission line with an electrical length of $\lambda_1/2$ at a frequency of 3 GHz may have an electrical length of $\lambda_2/4$ at 1.5 GHz. Likewise, a second transmission line with an electrical length of $\lambda_1/4$ at a frequency of 3 GHz may have an electrical length of $\lambda_2/8$ at 1.5 GHz. Thus, while the differential phase shift between the two transmission lines at 3 GHz is $\lambda/4$, the differential phase shift between the same two transmission lines at 1.5 GHz is $\lambda/8$.

In response to the need to maintain a single phase shift over a range of frequencies, switched-line phase shifters utilizing parallel coupled-transmission lines (hereinafter "Schiffman sections") have been developed. Such phase shifters are described by B. M. Schiffman in the paper entitled "A New Class of Broad-Band Microwave 90-Degree Phase Shifters," IRE Transactions on Microwave Theory and Technique, April 1958, pages 232–237.

One problem with switched-line phase shifters, including Schiffman-type phase shifters using series switches, is that when the effective electrical length of the switched-off transmission path is an integer multiple of 180° (half the wavelength of the operating frequency), a resonance is established in the switched-off path. The resonance results from the practical implementation of switching devices that have leakage capacitance. Although the switched-off path is theoretically isolated from the external network, in actuality the switched-off path is capacitively coupled to the external network. Since the switched-off path is coupled to the rest of the network (including the switched-on transmission path), the effects of the switched-off path resonance are seen in the performance of the switched-on path as well. In particular, the resonance results in phase shifter operating points of high signal attenuation (also known as isolation points) at the operating frequencies associated with the points of resonance.

Various techniques have been proposed to reduce the resonance effect. For example, the use of transfer switches instead of standard single pole double throw (hereinafter "SPDT") switches to switch between transmission paths has been explored. In a transfer switch implementation, when a transmission path is switched off, it is connected to a load with a matching characteristic impedance. Although the resonance problem can be reduced through the use of transfer switches, the performance of a switched-line phase shifter using this loading technique suffers the disadvantage of considerable driver circuit complexity. In addition, the bandwidth of such a phase shifter is limited due to the RF properties of the associated switching devices and load circuitry.

Another technique that has been explored, for example in the paper entitled "An Octave-Band Switched-Line Microstrip 3-b Diode Phase Shifter," IEEE Transactions on Microwave Theory and Techniques, Vol. MTT-21, No. 7, July 1973, pages 444–449, is the use of shunt switches instead of series switched in the switched-line configuration. Though theoretically appealing, the performance of switched-line phase shifters utilizing shunt switches in practice is severely degraded due to the parasitic reactance present in practical switching devices. Furthermore, they use quarter-wave transformers to isolate the switched-off path at the input and output ports of the switched-line phase shifter. However, the quarter-wave transformers cannot be operated over a wide bandwidth, and thus limit the effective bandwidth of the phase shifter.

A need has long existed for a wide-bandwidth switched-line phase shifter with relatively constant phase-frequency characteristics that eliminates isolation points over the design operating frequency range without incorporating complex circuitry or introducing substantial performance degradation.

SUMMARY OF THE INVENTION

It is an object of present invention to provide a switched-line phase shifter. It is another object of the present invention to provide a switched-line phase shifter with relatively constant phase-frequency characteristics which avoids isolation points in the design operating frequency range.

It is a further object of the present invention to provide a switched-line phase shifter which avoids isolation points in the design operating frequency range by incorporating Schiffman sections of non-conventional length.

It is a still further object of the present invention to provide a space-efficient implementation of a switched-line phase shifter incorporating an adjustable-length Schiffman section comprising several switchably connected Schiffman subsections.

One or more of the foregoing objects is met in whole or in part by a preferred embodiment of the present invention that provides a compact switched-line phase shifter incorporating Schiffman sections of non-conventional length. The lengths of the Schiffman sections are chosen such that the effective electrical lengths of the individual transmission paths of the switched-line phase shifter do not become integer multiples of 180° (half wavelength) over the design operating frequency range of the phase shifter. A space-efficient implementation of a switched-line phase shifter incorporating Schiffman sections is also provided. A plurality of Schiffman subsections are switchably connected to form a Schiffman section of variable length, thereby efficiently utilizing one or more Schiffman subsections in multiple switched transmission paths.

DETAILED DESCRIPTION OF THE PREFERRED EMBODIMENT

Figure 1:
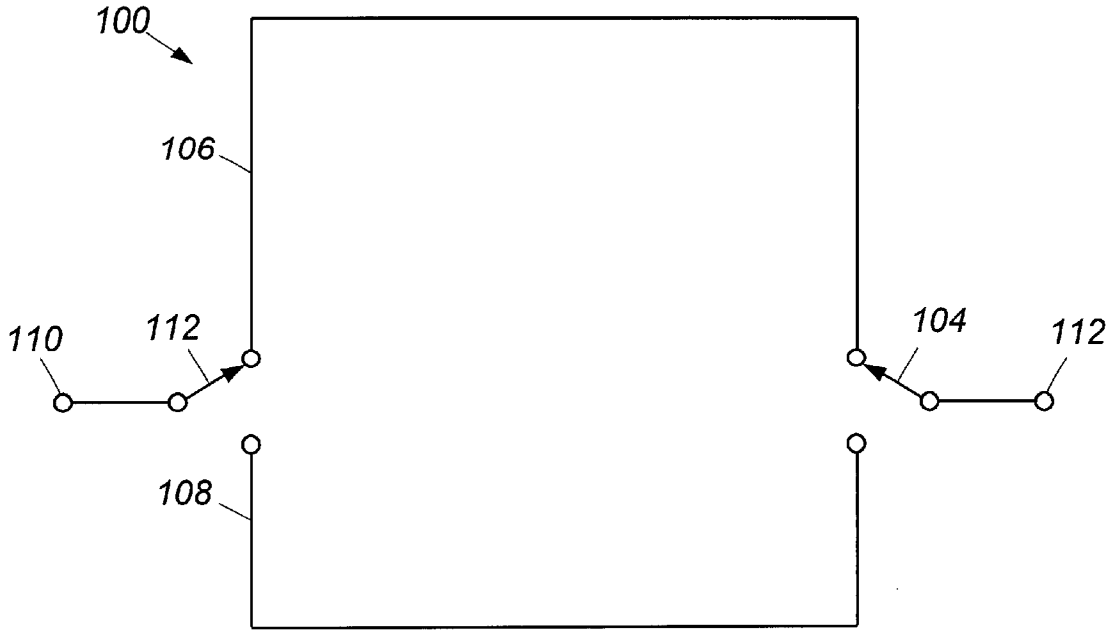
Figure 1 Prior Art
FIG. 1 illustrates a conventional switched-line phase shifter.

FIG. 1 illustrates a conventional switched-line phase shifter 100 with uniform transmission lines. Two SPDT switches 102, 104 are used to alternately connect two transmission paths 106, 108 between an input port 110 and an output port 112. Differences in length between the first transmission path 106 and the second transmission path 108 result in different signal propagation times through the two paths 106, 108. The different signal propagation times, in turn, result in a differential phase shift between a signal propagated through the two paths 106, 108.

For example, if the length of the first transmission path 106 is equal to the wavelength ($\lambda_o$) of a signal of frequency $f_o$ being propagated through it, and the length of the second transmission path 108 is equal to half of the wavelength ($\lambda_o/2$) of the signal being propagated through it, the differential phase shift between the two transmission paths 106, 108 is $180°=2\ \pi/\lambda_o(\lambda_0-\lambda_o/2)$.

As mentioned previously, a problem with conventional switched-line phase shifters incorporating uniform transmission lines is that the realized differential phase shift is a function of the frequency of the signal applied to the phase shifter. For example, considering the example of the previous paragraph, if a signal of frequency $f=1.2f_o$ (and thus wavelength $\lambda=\lambda_o/1.2$) is applied to the phase shifter, the effective electrical length of the first transmission path 106 becomes $1.2\lambda$, and the effective electrical length of the second transmission path 108 becomes $1.2\ \lambda/2$. The differential phase shift between the two transmission paths 106, 108 becomes $2\pi/\lambda(1.2\lambda/2)$ (or approximately 216°).

Figure 2:
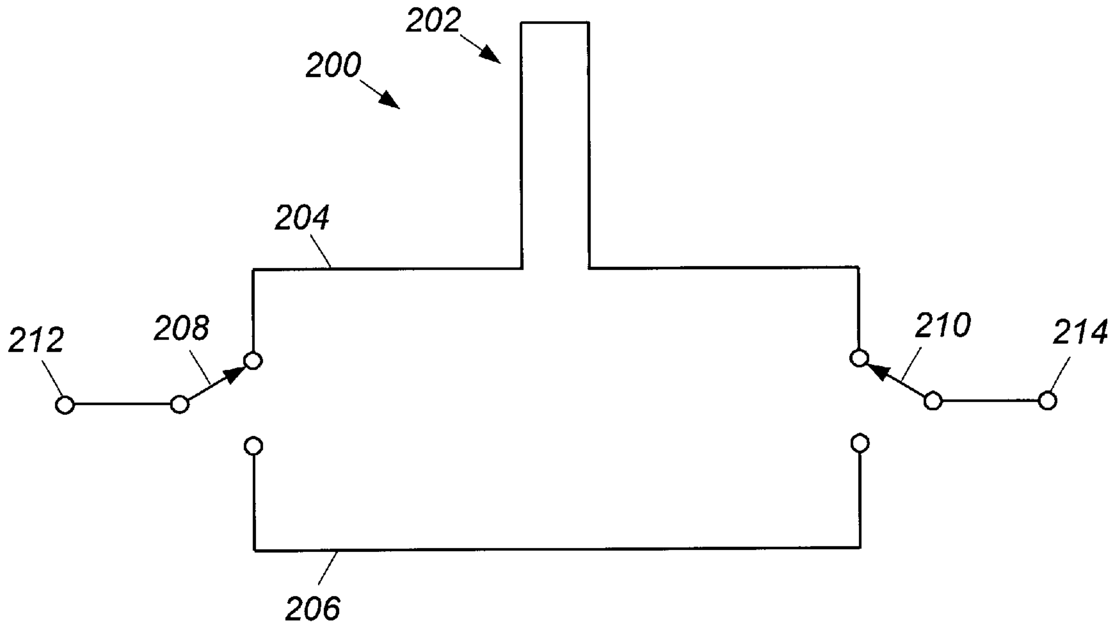
FIG. 2 shows a switched-line phase shifter incorporating a Schiffman coupled-line section.

Turning now to FIG. 2, that figure shows an example of a Schiffman-type phase shifter 200 that includes a Schiffman section 202 in a first transmission path 204 and an uncoupled uniform transmission line in a second transmission path 206. In accordance with the conventional series switched-line phase shifter configuration, two switches 208, 210 alternately connect the first transmission path 204 and the second transmission path 206 between the input port 212 and the output port 214 of the phase shifter 200.

In the Schiffman phase shifter 200, the difference in physical transmission path lengths is still a determining factor in the realized differential phase shift. However, the coupling between the parallel coupled transmission line segments of the Schiffman section may, for a finite frequency bandwidth, result in a phase-frequency relationship for the first transmission path 204 that closely resembles the phase-frequency relationship for the second transmission path 206. Thus, over the finite frequency bandwidth, a substantially constant differential phase shift between the switched transmission paths 204, 206 may be obtained.

The phase shift through a Schiffman section is presented by E. M. T. Jones and J. T. Bolljahn in the paper entitled "Coupled Strip Transmission Line Filters and Directional Couplers," IRE Transactions on Microwave Theory and Techniques, vol. MTT-4, April 1956, pp. 75–81. The phase $\phi$ shift is:

$$\phi = \cos^{-1}\left[\frac{\rho - \tan^2\theta}{\rho + \tan^2\theta}\right] \tag{1}$$

where $\rho$ is a ratio of the even and odd mode characteristic impedances of the transmission line ($\rho=Z_{oe}/Z_{oo}$) and $\theta$ is the electrical length of the transmission line ($\theta=\beta l$), where $\beta$ is a phase constant, and l is the length of the transmission line.

As mentioned previously, a resonance problem exists in both conventional switched-line phase shifters 100, as illustrated in FIG. 1, and Schiffman-type phase shifters 200, as illustrated in FIG. 2. Since practical switching devices have finite parasitic capacitances, energy is coupled to the switched-off transmission path. When the frequency of the signal input to a series switched-line phase shifter is such that the effective electrical length of the switched-off transmission path is an integer multiple of half the wavelength of the input signal, a resonance is established in the switched-off path. The capacitive coupling between the input and output ports and the switched-off path allows energy to flow into the switched-off path to maintain the resonance. In addition, the capacitive coupling also allows energy from the resonance in the switched-off path to interfere with the signal propagating through the switched-on path. Thus a resonance established in either transmission path, when switched off, results in severe performance degradation for the switched-line phase shifter.

The points of resonance (also referred to as isolation points) cause severe performance degradation at one or more frequencies in the operating frequency range of the phase shifter. Either the performance degradation at the isolation points must be accepted, additional circuitry must be added to compensate for the performance degradation at the isolation points, or the isolation points must be avoided.

The present invention effectively eliminates isolation points in the design operating frequency band by relocating the isolation points out of the design operating frequency band. As explained in more detail below, the present invention utilizes Schiffman sections of non-conventional length to accomplish the relocation of isolation points.

In the past, lengths of Schiffman sections have been chosen to be integer multiples of quarter-wavelength (i.e. integer multiples of a quarter wavelength) at the design primary operating frequency for the phase shifter. Unfortunately, the use of Schiffman sections of lengths which are integer multiples of quarter-wavelength typically results in the creation of isolation points in the design operating frequency band.

For example, if the Schiffman section length for a transmission line is chosen to be $\lambda/4$ at the primary operating frequency for the phase shifter, the effective electrical length of the section will be close to $\lambda/2$ (or 180°). Adding the effects of the parasitic coupling capacitances of the switching devices may, for example, result in a transmission path with an effective electrical length of approximately 200°. A change in operating frequency f from $f_{primary}$ to $0.9*f_{primary}$ would then result in operation at an isolation point. Thus while the example phase shifter may work well at the primary operating frequency, a relatively small shift in operating frequency results in severely degraded performance. In addition, the practical electrical length of a transmission path may also vary unpredictably due to non-constant and inconsistent switching device characteristics and manufacturing process variances.

Figure 3:
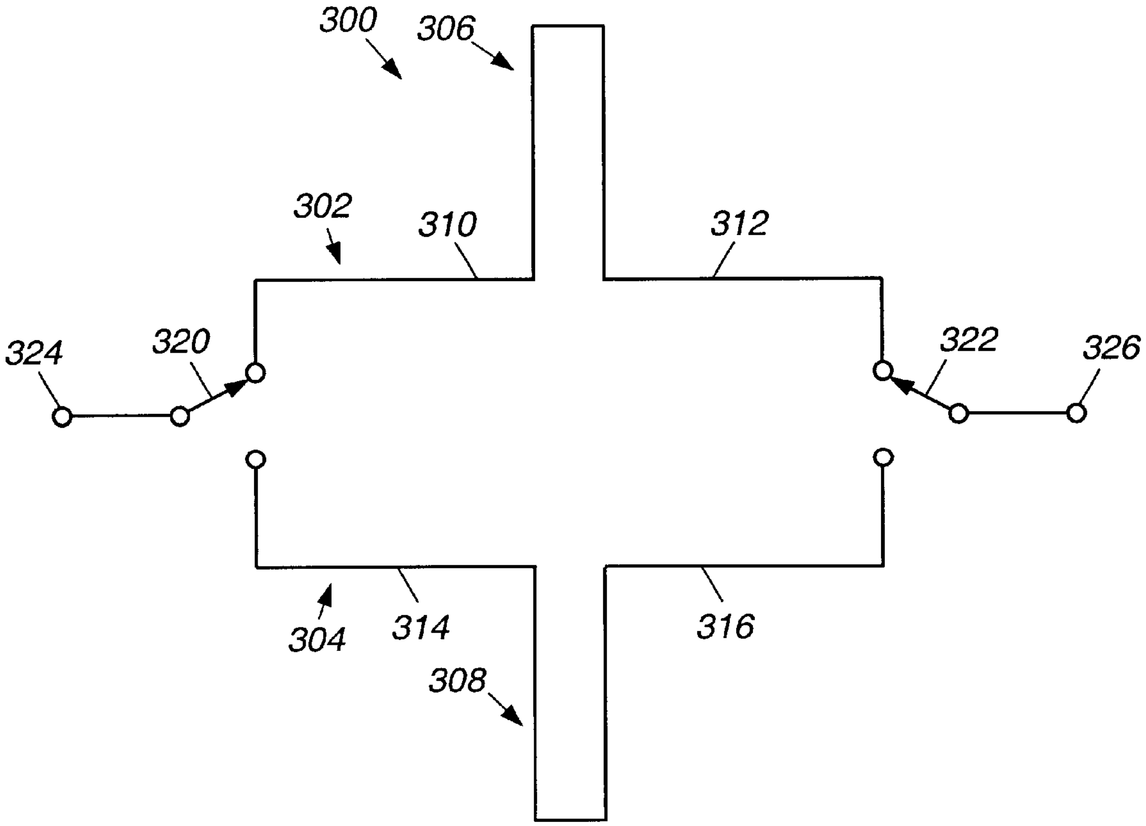
FIG. 3 shows a switched-line phase shifter incorporating Schiffman sections of non-conventional length.

FIG. 3 illustrates a series switched-line phase shifter 300 incorporating Schiffman sections 306, 308 of non-conventional length according to a preferred embodiment of the present invention. Each transmission path 302, 304 contains a Schiffman section 306, 308. The switching devices 320, 322 alternately connect the transmission paths 302, 304 between the input port 324 and the output port 326.

The phase shift through a Schiffman section was given earlier in equation (1). Equation (1) may be applied to the first Schiffman section 306 to arrive at the first Schiffman section 306 phase $\phi_1$ and to the second Schiffman section 308 to arrive at the second Schiffman section 308 phase $\phi_2$. Assuming similar lengths for the non-coupled transmission line sections 310, 312, 314, 316, the differential phase shift between the two transmission paths 302, 304 is calculated as the difference between the first Schiffman section 306 phase $\phi_1$ and the second Schiffman section 308 phase $\phi_2$ (or $\Delta\phi=\phi_2-\phi_1$)

Design parameters and resulting bandwidths for 45° and 90° switched-line phase shifters according to a preferred embodiment of the present invention are shown in Table 1. The bandwidths in Table 1 were measured about the primary operating frequency to points of 2° phase shift error. Note that the resulting operating frequency bands of each of the phase shifters do not contain isolation points.

TABLE 1

| Desired Phase Shift | Design Parameters $\theta_1$ | $\rho_1$ | $\theta_2$ | $\rho_2$ | Resulting Bandwidth (in terms of $\theta_1$) |
|---|---|---|---|---|---|
| 45° | 140° | 1.8 | 118° | 1.8 | 105° to 180° (0.614 octaves) |
| 90° | 140° | 1.9 | 99.6° | 1.7 | 126° to 180° (0.428 octaves) |

As an example, choosing 3 GHZ as an example primary operating frequency $f_o$ for a 45° phase shifter, the corresponding full wavelength $\lambda_o$ is 0.1 meters. The electrical length for the first transmission path is chosen to be 140° (approximately 0.038889 meters), and the electrical length for the second transmission path is chosen to be 118° (approximately 0.032778 meters). Notice that neither electrical length of either transmission path is relatively near an isolation point at the primary operating frequency (0.05 meters being the closest integer multiple of $\lambda_o/2$)

The electrical length for the first transmission path is an integer multiple of 180° when the operating frequency is approximately 3.86 GHz, and the electrical length of the second transmission path is an integer multiple of 180° when the operating frequency is approximately 4.58 GHz. According to Table 1, the operating frequency band in which an absolute phase error of less than 2° is experienced ranges from $f_{min}=0.75f_o$ to $f_{max}=1.287f_o$ (or $f_{min}=2.25$ GHz to $f_{max}=3.86$ GHz for the example chosen). Thus, no isolation points exist within the operating frequency range.

Figure 4A:
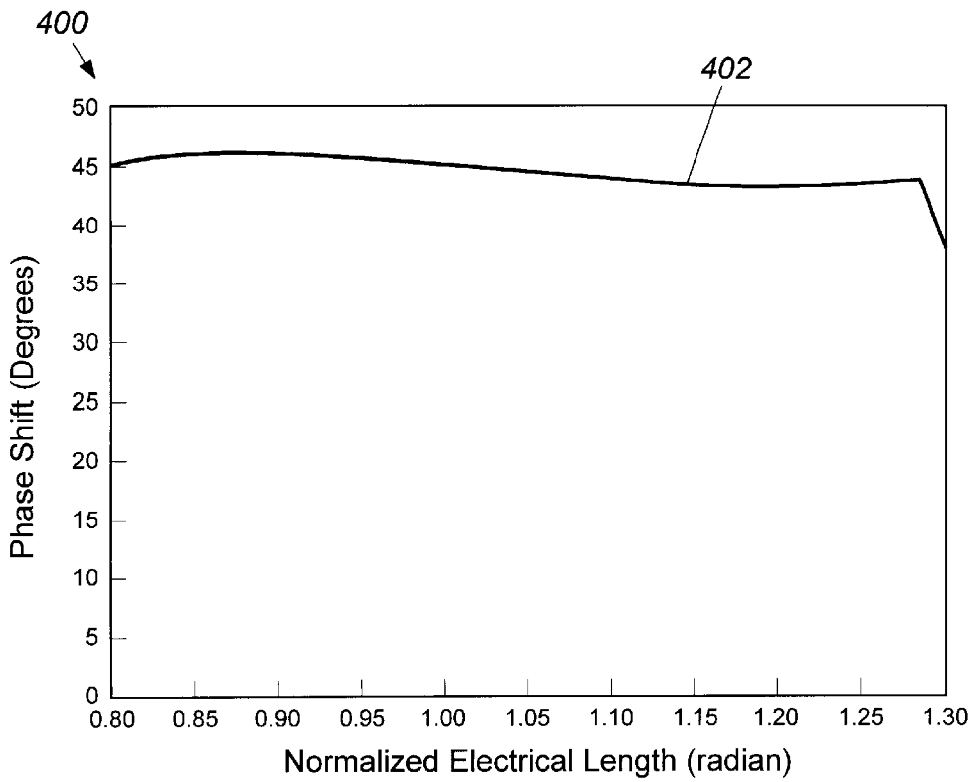
FIG. 4*a* contains a plot showing performance of an example 45° phase shifter.

FIG. 4*a* illustrates a plot 400 showing performance of a 45° phase shifter designed in accordance with the design parameters presented in Table 1. The plot line 402 illustrates the calculated differential phase shift as a function of normalized electrical length.

Figure 4B:
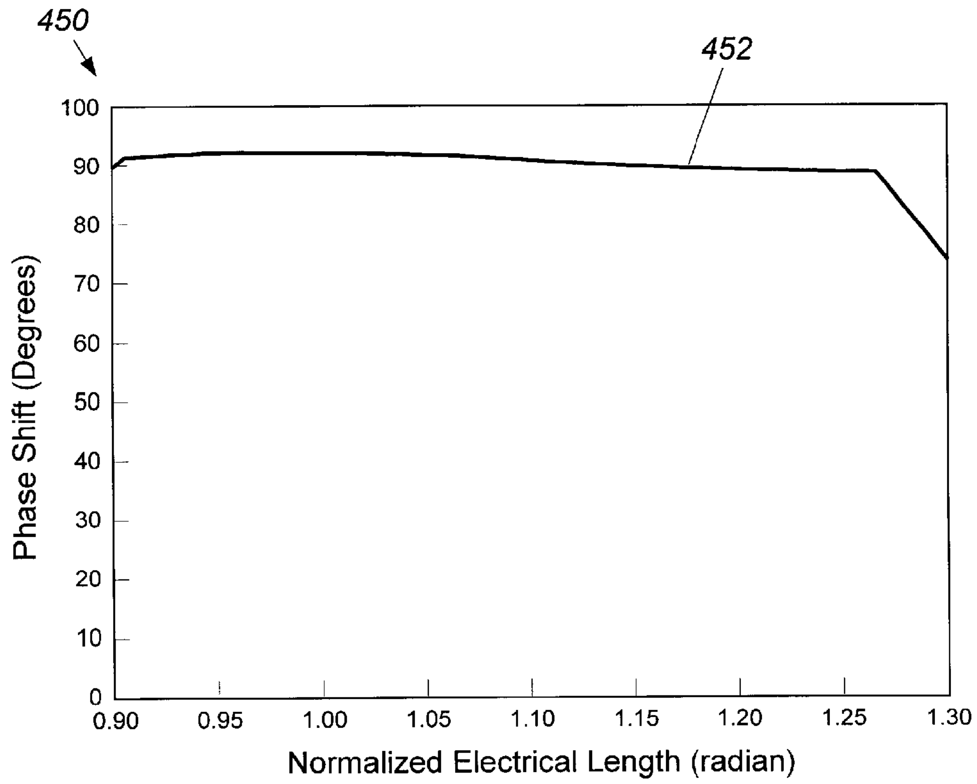
FIG. 4*b* contains a plot showing performance of an example 90° phase shifter.

Likewise, FIG. 4*b* shows a plot 450 showing performance of an example 90° phase shifter designed in accordance with the design parameters shown in Table 1. The plot line 452 illustrates the calculated differential phase shift as a function of normalized electrical length.

Figure 5:
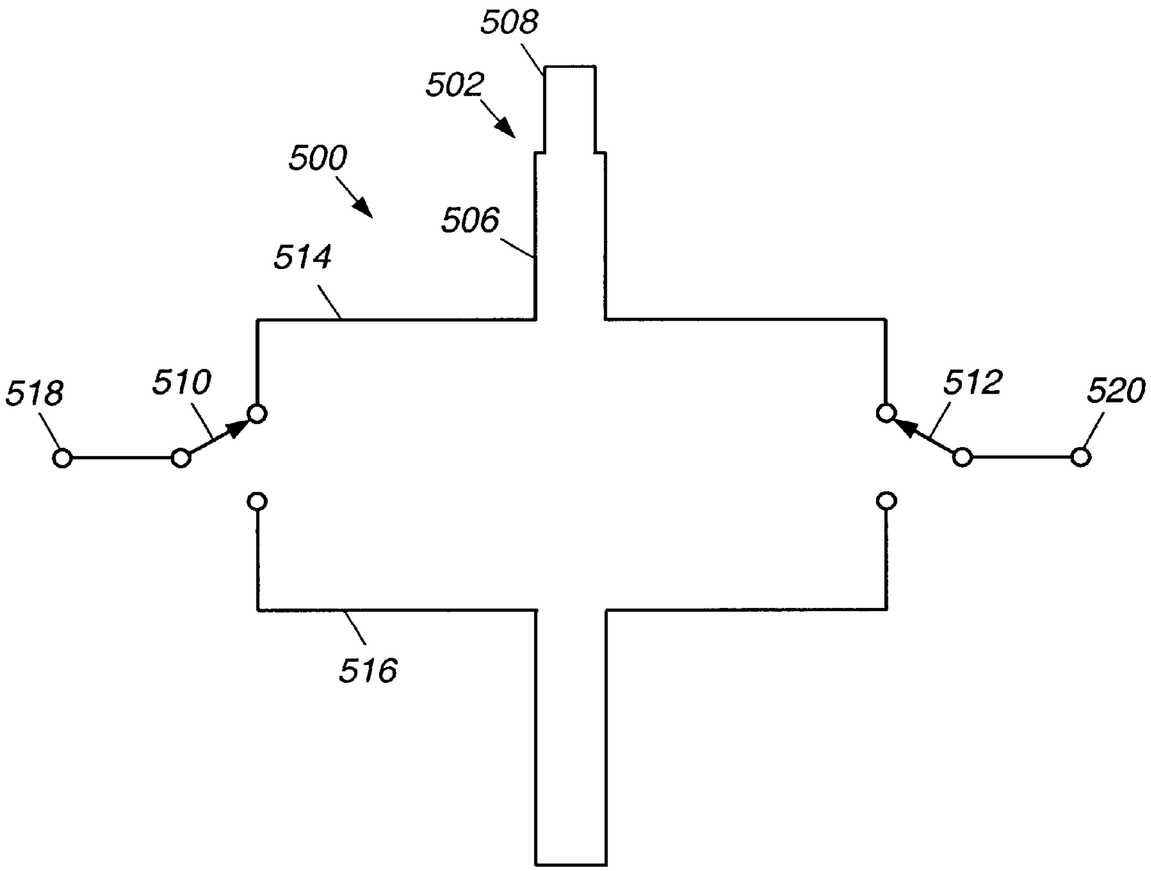
FIG. 5 shows a switched-line phase shifter incorporating a multi-subsection Schiffman section of non-conventional length.

Note that the inventive concept also applies to switched-line phase shifters incorporating multi-subsection Schiffman sections. FIG. 5 shows a switched-line phase shifter 500 incorporating a multi-subsection Schiffman section 502 of non-conventional length according to an alternative embodiment of the present invention. The Schiffman section 502 may comprise multiple Schiffman subsections 506, 508 which when combined, form a total effective electrical length that is not an integer multiple of quarter-wavelength. The paper, "A New Class of Broad-Band Microwave 90-Degree Phase Shifters," gives an equation for calculating the phase for coupled line all-pass cascaded sections having unequal lengths and coupling factors as:

$$\phi_1 = \cos^{-1}\left[\frac{\rho_1 - \tan^2\theta_1'}{\rho_1 + \tan^2\theta_1'}\right] \tag{2}$$

where $\rho_1=Z_{oe1}/Z_{oo1}$ of the first subsection, where $$\theta_1' = \theta_1 + \tan^{-1}\left[\frac{Z_{ooc}}{Z_{ool}}\tan\theta_c\right] \tag{3}$$

and where $\theta_1$ is the electrical length of the first subsection 506, $\theta_c$ is the electrical length of the cascaded subsection 508, and $Z_{ooc}$ is the odd mode characteristic impedance of the cascaded subsection 508. The switching devices 510, 512 alternately connect the first transmission path 514 and the second transmission path 516 between the input port 518 and the output port 520.

Figure 6:
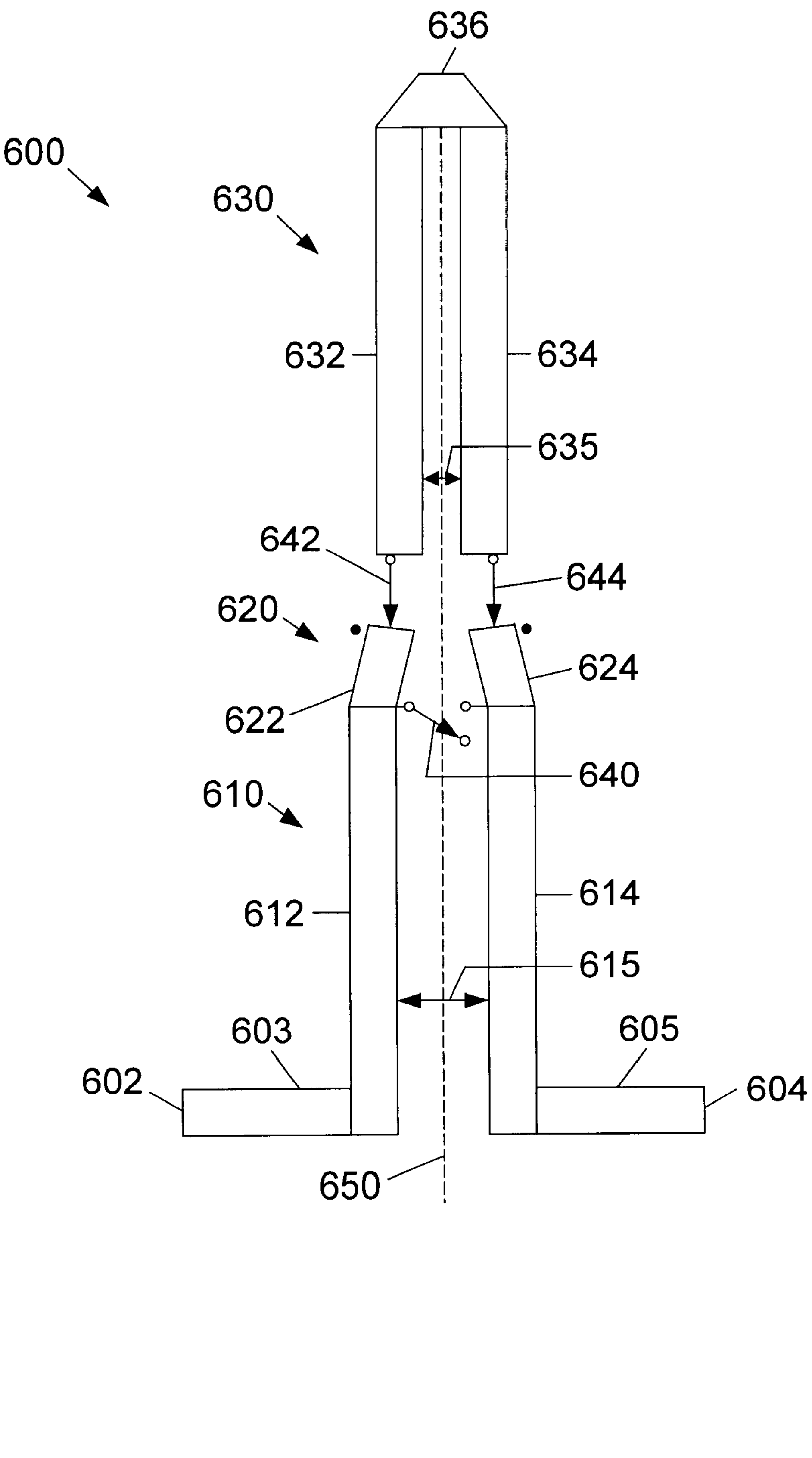
FIG. 6 illustrates a space-efficient implementation of a Schiffman-type switched-line phase shifter.

Incorporating Schiffman sections into multiple transmission paths of a switched-line phase shifter typically results in increased circuit space requirements. Because, in switched-line phase shifters, a significant portion of the conductor is typically duplicated in alternate transmission paths, an implementation of a switched-line phase shifter which efficiently shares conductor length, and thus circuit space, between alternate transmission paths may result in the realization of substantial circuit space savings. FIG. 6 illustrates a space-efficient implementation of a multi-subsection Schiffman-type switched-line phase shifter 600 according to a preferred embodiment of the present invention.

The phase shifter 600 has an input port 602 connected to the left end of a first non-coupled conductor 603 and an output port 604 connected to the right end of a second non-coupled conductor 605. A first Schiffman section 610 has a left conductor 612, the lower end of which is connected to the right end of the first non-coupled conductor 603, and a right conductor 614, the lower end of which is connected to the left end of the second non-coupled conductor 605. A transition section 620 has a left conductor 622, the lower end of which is connected to the upper end of the left conductor 612 of the first Schiffman section 610, and a right conductor 624, the lower end of which is connected to the upper end of the right conductor 614 of the first Schiffman section 610. A second Schiffman section 630 has a left conductor 632, the upper end of which is connected to the left end of an end conductor 636, and a right conductor 634, the upper end of which is connected to the right end of the end conductor 636.

The conductors 612, 614 of the first Schiffman section 610 run parallel to each other along a main longitudinal axis 650 separated by a first spacing 615. The conductors 632, 634 of the second Schiffman section 630 run parallel to each other and preferably along the main longitudinal axis 650 separated by a second spacing 635 which may be different than the first spacing 615. The conductors 622, 624 of the transition section 620 are positioned between the upper ends of the conductors 612, 614 of the first Schiffman section 610 and the lower ends of the conductors 632, 634 of the second Schiffman section 630. The conductors 622, 624 of the transition section 620 provide a conductive spacing transition between the conductors 612, 614 of the first Schiffman section 610 and the conductors 632, 634 of the second Schiffman section 630.

A first single pole single throw (hereinafter "SPST") switching device 640 is connected between the upper ends of the left conductor 612 and the right conductor 614 of the first Schiffman section 610. A second SPST switching device 642 is connected between the upper end of the left conductor 622 of the transition section 620 and the lower end of the left conductor 632 of the second Schiffman section 630. A third SPST switching device 644 is connected between the upper end of the right conductor 624 of the transition section 620 and the lower end of the right conductor 634 of the second Schiffman section 630.

To form a first transmission path between the input port 602 and the output port 604, the switching devices 640, 642, 644 assume a first switch state forming a first Schiffman section. In the first switch state, the first switching device 640 conductively connects the upper ends of the conductors 612, 614 of the first Schiffman section 610, and the second and third switching devices 642, 644 break the connection between the upper ends of the conductors 622, 624 of the transition section 620 and the lower ends of the conductors 632, 634 of the second Schiffman section 630. A conductive path is thereby created from the input port 602 to the output port 604 through the first non-coupled conductor 603, the left conductor 612 of the first Schiffman section 610, the first switching device 640, the right conductor 614 of the first Schiffman section 610 and the second non-coupled conductor 605.

To form a second transmission path between the input port 602 and the output port 604, the switching devices 640, 642, 644 assume a second switch state forming a second Schiffman section. In the second switch state, the first switching device 640 breaks the connection between the upper ends of the conductors 612, 614 of the first Schiffman section 610. The second switching device 642 conductively connects the upper end of the left conductor 622 of the transition section 620 to the lower end of the left conductor 632 of the second Schiffman section 630. The third switching device 644 conductively connects the upper end of the right conductor 624 of the transition section 620 to the lower end of the right conductor 634 of the second Schiffman section 630. A conductive path is thereby created from the input port 602 to the output port 604 through the first non-coupled conductor 603, the left conductor 612 of the first Schiffman section 610, the left conductor 622 of the transition section 620, the second switching device 642, the left conductor 632 of the second Schiffman section 630, the end conductor 636, the right conductor 634 of the second Schiffman section 630, the third switching device 644, the right conductor 624 of the transition section 620, the right conductor 614 of the first Schiffman section 610 and the second non-coupled conductor 605.

Note that both the first transmission path and the second transmission path include the first non-coupled conductor 603, both conductors 612, 614 of the first Schiffman section 610 and the second non-coupled conductor 605. The sharing of conductor length, and hence circuit space, results in the realization of substantial circuit space savings.

The present invention provides a switched-line phase shifter with continuous and effective operation throughout the operating frequency band. The removal of isolation points from the operating frequency band results in more reliable phase shifter operation. The phase shifter is more robust with regard to varying operating conditions and variances in electrical component characteristics and manufacturing processes. In addition, the space-efficient implementation of the present invention results in the realization of substantial circuit space savings.

While particular elements, embodiments and applications of the present invention have been shown and described, it will be understood that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. A switched-line phase shifter for producing a differential phase shift over a frequency bandwidth of operation, said switched-line phase shifter comprising:

- an input port;
- an output port;
- a first transmission path comprising a first Schiffman section having a first electrical length that is a first non-integer multiple of a predetermined desired operating frequency quarter-wavelength;
- a second transmission path; and
- at least one switch selectively connecting said first transmission path and said second transmission path between said input port and said output port.

2. The switched-line phase shifter of claim 1, wherein said second transmission path comprises a second Schiffman section having a second electrical length that is a second non-integer multiple of the predetermined desired operating frequency quarter-wavelength.

3. The switched-line phase shifter of claim 1, wherein said first Schiffman section includes at least one Schiffman subsection.

4. The switched-line phase shifter of claim 2, wherein at least one of the first Schiffman section and the second Schiffman section includes at least one Schiffman subsection.

5. The switched-line phase shifter of claim 1, wherein the differential phase shift is between 45 and 90 degrees inclusive.

6. The switched-line phase shifter of claim 1, wherein the bandwidth of operation spans at least 0.4 octaves.

7. The switch-line phase shifter of claim 1, wherein the bandwidth of operation spans at least 0.6 octaves.

8. A switched-line phase shifter for producing a differential phase shift over a frequency bandwidth of operation, said switched-line phase shifter comprising:

- an input port;
- an output port;
- a first transmission path comprising a first Schiffman section having a first electrical length;
- a second transmission path comprising said first Schiffman section and a second Schiffman section having a second electrical length; and
- at least one switch for alternately connecting said first Schiffman section and a combination of said first Schiffman section and said second Schiffman section between said input port and said output port.

9. The switched-line phase shifter of claim 8, wherein said at least one switch alternately conductively connects said second Schiffman section to said first Schiffman section thereby establishing a combined Schiffman section in said second transmission path and disconnects said second Schiffman section from said first Schiffman section thereby establishing a single Schiffman section in said first transmission path.

10. A method for differentially phase shifting an input signal, the method comprising:

applying the input signal to an input port; and switching the input signal between a first transmission path comprising a first Schiffman section having a first electrical length that is a first non-integer multiple of a predetermined desired operating frequency quarter-wavelength and a second transmission path to induce a desired phase shift in the input signal.

11. The method of claim 10, further comprising applying the input signal with the desired phase shift to an output port.

12. The method of claim 10, wherein switching further comprises switching the input signal between the first transmission path and a second Schiffman section in the second transmission path.

13. method of claim 12, wherein switching further comprises switching the input signal between the first transmission path and the second Schiffman section characterized by a second electrical length that is a second non-integer multiple of the predetermined desired operating frequency quarter-wavelength.

14. The method of claim 12, wherein switching further comprises switching the input signal between the first Schiffman section including at least one Schiffman subsection and the second transmission path.

15. The method of claim 14, wherein switching further comprises switching the input signal between the first transmission path and the second Schiffman section including at least one Schiffman subsection.

16. A switched-line phase shifter for producing a differential phase shift over a frequency bandwidth of operation, said switched-line phase shifter comprising:

an input port;

an output port;

a first transmission path comprising a first Schiffman section having a first electrical length that is a first non-integer multiple of a desired operating frequency quarter-wavelength;

a second transmission path comprising said first Schiffman section and a second Schiffman section having a second electrical length; and at least one switch for alternately connecting said first Schiffman section and a combination of said first Schiffman section and said second Schiffman section between said input port and said output port.

17. The switched-line phase shifter of claim 16, wherein the second electrical length of said second Schiffman section is a second non-integer multiple of the desired operating frequency quarter-wavelength.

18. A switched-line phase shifter for producing a differential phase shin over a frequency bandwidth of operation, said switched-line phase shifter comprising:

an input port;

an output port;

a first transmission path comprising a first Schiffman section having a first electrical length;

a second transmission path comprising said first Schiffman section and a second Schiffman section having a second electrical length, wherein the difference between the first electrical length of the first Schiffman section and the second electrical length of the second Schiffman section is substantially different than the differential phase shift at a desired operating frequency; and at least one switch for alternately connecting said first Schiffman section and a combination of said first Schiffman section and said second Schiffman section between said input port and said output port.

19. The switched-line phase shifter of claim 14, wherein the difference between the first electrical length of the first Schiffman section and the second electrical length of the second Schiffman section differs from the differential phase shift by at least 20 percent of the design phase shift at the desired operating frequency.

* * * * *